(12) United States Patent
Nakiboglu et al.

(10) Patent No.: US 10,114,299 B2
(45) Date of Patent: Oct. 30, 2018

(54) LITHOGRAPHIC APPARATUS

(71) Applicant: ASML Netherlands B.V., Veldhoven (NL)

(72) Inventors: Günes Nakiboglu, Eindhoven (NL); Mark Constant Johannes Baggen, Eindhoven (NL); Gerard Johannes Boogaard, Zaltbommel (NL); Nicolaas Rudolf Kemper, Eindhoven (NL); Sander Kerssemakers, Eindhoven (NL); Robertus Mathijs Gerardus Rijs, Sevenum (NL); Frank Johannes Jacobus Van Boxtel, Eindhoven (NL); Erwin Antonius Henricus Franciscus Van Den Boogaert, Someren (NL); Marc Wilhelmus Maria Van Der Wijst, Veldhoven (NL); Martinus Van Duijnhoven, Deurne (NL); Jessica Henrica Anna Verdonschot, Leende (NL); Hendrikus Herman Marie Cox, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/311,544

(22) PCT Filed: May 7, 2015

(86) PCT No.: PCT/EP2015/060096
§ 371 (c)(1),
(2) Date: Nov. 16, 2016

(87) PCT Pub. No.: WO2015/185320
PCT Pub. Date: Dec. 10, 2015

(65) Prior Publication Data
US 2017/0090296 A1      Mar. 30, 2017

(30) Foreign Application Priority Data

Jun. 5, 2014   (EP) .................................... 14171394

(51) Int. Cl.
    G10K 11/168    (2006.01)
    G03F 7/20      (2006.01)
    G10K 11/16     (2006.01)

(52) U.S. Cl.
    CPC .............. *G03F 7/709* (2013.01); *G10K 11/16* (2013.01); *G10K 11/168* (2013.01)

(58) Field of Classification Search
    CPC ........ G03F 7/707; G10K 11/16; G10K 11/168
    See application file for complete search history.

(56) References Cited

U.S. PATENT DOCUMENTS

| | | | | |
|---|---|---|---|---|
| 5,545,861 A | * | 8/1996 | Morimoto | ............... A47H 21/00 181/290 |
| 2003/0006092 A1 | * | 1/2003 | D'Antonio | ................ E04B 1/86 181/293 |

(Continued)

FOREIGN PATENT DOCUMENTS

| | | |
|---|---|---|
| JP | H10-264737 A | 10/1998 |
| JP | 2010-229737 A | 10/2010 |

(Continued)

OTHER PUBLICATIONS

English-Language Abstract for Japanese Patent Publication No. 2010-229737 A, published Oct. 14, 2010; 2 pages.

(Continued)

*Primary Examiner* — Michelle M Iacoletti
(74) *Attorney, Agent, or Firm* — Sterne, Kessler, Goldstein & Fox P.L.L.C.

(57) ABSTRACT

A lithographic apparatus has a compartment which accommodates a movable object. Movements of the movable object cause acoustic disturbances in the compartment. An (Continued)

acoustic damper is arranged to damp the acoustic disturbances in the compartment and comprises a chamber (100) in communication with the compartment and a perforated plate (101), having a plurality of through-holes (102), between the chamber and the compartment.

19 Claims, 7 Drawing Sheets

(56) References Cited

U.S. PATENT DOCUMENTS

| | | | |
|---|---|---|---|
| 2005/0103508 A1* | 5/2005 | Atkinson | B25D 17/02 173/1 |
| 2005/0139790 A1* | 6/2005 | Boogaarts | G01N 21/8851 250/548 |
| 2005/0161280 A1 | 7/2005 | Furuya | |
| 2005/0252714 A1* | 11/2005 | Goda | B29C 44/583 181/252 |
| 2007/0146656 A1 | 6/2007 | Van Empel | |
| 2008/0291413 A1* | 11/2008 | Steijaert | G03F 7/70775 355/53 |
| 2009/0161085 A1 | 6/2009 | Butler et al. | |
| 2009/0195760 A1 | 8/2009 | Hempenius et al. | |
| 2010/0171022 A1 | 7/2010 | Fujimaki et al. | |
| 2012/0242271 A1 | 9/2012 | Van Der Toorn et al. | |
| 2013/0082194 A1 | 4/2013 | Muto et al. | |
| 2013/0228686 A1 | 9/2013 | Muto et al. | |
| 2015/0211226 A1* | 7/2015 | Yawagiwa | G10K 11/168 181/292 |

FOREIGN PATENT DOCUMENTS

| | | |
|---|---|---|
| JP | 2010-238984 A | 10/2010 |
| WO | WO 2008/090975 A1 | 5/2010 |

OTHER PUBLICATIONS

English-Language Abstract for Japanese Patent Publication No. 2010-238984 A, published Oct. 21, 2010; 1 page.

International Search Report and Written Opinion of the International Searching Authority, directed to related International Patent Application No. PCT/EP2015/060096, dated Jul. 20, 2015; 10 pages.

International Preliminary Report on Patentability of the International Searching Authority, directed to related International Patent Application No. PCT/EP2015/060096, dated Dec. 6, 2016; 6 pages .

"Low—Mid Absorbers," SAE B.V. Amsterdam, 2008, archived by Internet Archive Wayback Machine, accessed through http://www.sae.edu/reference_material/audio/pages/Low%20Mid%20Frequencies.htm; 2 pages.

* cited by examiner

LITHOGRAPHIC APPARATUS

CROSS-REFERENCE TO RELATED APPLICATIONS

This application claims the benefit of European patent application 14171394.1, which was filed on 5 Jun. 2014, and which is incorporated herein in its entirety by reference.

BACKGROUND

Field of the Invention

The present invention relates to a lithographic apparatus.

Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

An object in a lithographic apparatus, for example a substrate table or a support structure for a patterning device, that moves in a gaseous environment can create an acoustic disturbance, so-called acoustic pressure waves, e.g. acoustic noise. An acoustic disturbance within the apparatus can cause disturbing forces that result in errors in the positioning of objects such as the substrate or the patterning device, which can in turn lead to overlay or other imaging errors. Such positioning errors can be caused by the acoustic disturbance acting directly on the object being positioned or indirectly, e.g. by the acoustic disturbance affecting measuring systems such as grid-encoder based or interferometer positioning systems or alignment sensors.

US 2012/0242271 A1 discloses an approach to minimizing the effect of noise on the positioning of an object table by sensing the noise and taking account of the sensed noise in control of the position of the object. It is also suggested that passive dampers such as Helmholtz resonators can be placed adjacent to the projection system to dampen vibrations at specific frequencies. However, these approaches do not address all acoustic disturbances that can occur.

SUMMARY

It is desirable to provide an alternative approach to the mitigation of vibrations in a lithographic apparatus.

According to an aspect of the invention, there is provided a lithographic apparatus for applying a desired pattern onto a substrate, the apparatus comprising:

a compartment with a volume of gas;

a movable object within the compartment, wherein a movement of the movable object causes an acoustic disturbance in the gas in the compartment; and an acoustic damper arranged to damp the acoustic disturbances; wherein the acoustic damper comprises a chamber and a perforated plate, which has a plurality of through-holes therein, the perforated plate being arranged between the chamber and the compartment.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
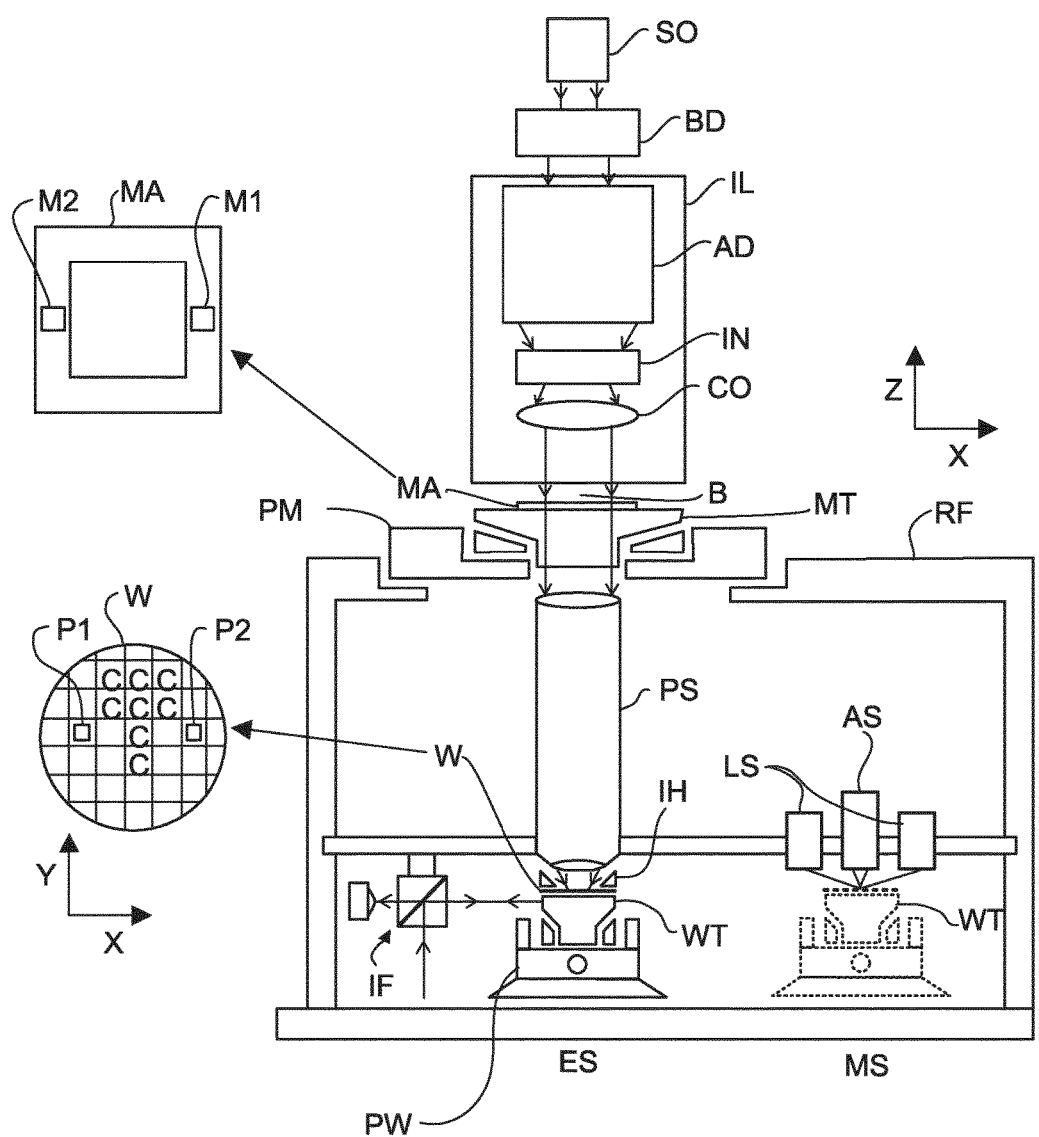
FIG. 1 depicts a lithographic apparatus.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

In a lithographic apparatus it is desirable to achieve a high through-put, i.e. a large number of substrates exposed per hour. To achieve a high through-put, the wafer tables and mask support structure are moved at high velocities and high accelerations. Other components of the apparatus may also be moved rapidly. These moving objects cause acoustic disturbances, e.g. noise. Such acoustic disturbances can affect the positioning of the mask and/or substrate through direct effects on the mask and/or substrate or indirectly, e.g. by disturbing measurement systems used in the control of the position of the mask and/or substrate. Therefore, it is desirable to minimize acoustic disturbances in the vicinity of the mask support structure and/or the substrate table.

The substrate table, for example, moves within a generally cuboid compartment referred to as the substrate stage compartment. The substrate stage compartment is filled with a gas, e.g. extremely clean dry air or an inert gas. In a lithographic apparatus that employs very short wavelength radiation to expose substrates, parts of the lithographic apparatus traversed by the radiation beam, e.g. the substrate stage compartment, may be filled with a low pressure of gas, e.g. hydrogen or helium, so as to minimize absorption of the very short wavelength radiation. The low pressure may be referred to as a "vacuum" environment but the present invention is applicable if the gas pressure in a part of the lithographic apparatus is sufficient to transmit acoustic disturbances.

The substrate stage compartment may be defined at a lower side by a base frame and/or a magnet plate for planar motors which drive the substrate table, at its upper side by a reference frame and around its side by parts of the base frame and/or removable compartment walls.

A simple cuboid compartment has many acoustic modes including axial modes, diagonal modes, tangential modes and oblique modes. In general an acoustic mode in a closed space is a standing pressure wave, typically a linear combination of elementary standing pressure waves in a regularly shaped space whose fundamental frequencies can be calculated theoretically. However, in a lithographic apparatus, the presence of one or more rapidly moving substrate tables, which have a significant size compared to the total volume of the compartment, greatly complicates the situation. The magnitude and/or frequency of the acoustic modes of the substrate stage compartment change depending on the momentary position of the substrate table(s) within the substrate stage compartment.

Each different recipe for the exposure of a substrate will involve different movements of the substrate table(s) and is therefore likely to excite different acoustic modes within the substrate stage compartment. Not only the position sensing system of the substrate stage, but also the various different sensors used to characterize a substrate (for example a level sensor or an alignment sensor) are sensitive to acoustic disturbances. Different sensors are sensitive to different frequencies of vibrations. Also, the parts of the apparatus that define the substrate stage compartment are not flat and various components of the apparatus project into the substrate stage compartment. Therefore, a theoretical determination of the acoustic modes of the substrate stage compartment is difficult. It is also difficult to predict which modes will be excited when the lithographic apparatus is operated and which modes will have the most detrimental effects.

Nevertheless, the present inventors have determined that acoustic disturbances having a frequency of less than a low frequency limit in the range of about 50 to about 70 Hertz are less detrimental to performance of the apparatus than acoustic disturbances having a frequency higher than the low frequency limit. The upper limit of sensitivity varies for different types of apparatus, in particular according to the time taken for measurements by the various sensors. In an embodiment, the sensitivity to acoustic vibration extends up to about 200-300 Hertz. In another embodiment, the sensitivity to acoustic disturbances extends up to about 1000 Hertz.

To significantly dampen disturbances having a frequency in the range of from about 50 Hertz or about 70 Hertz to about 200 Hertz or to about 1000 Hertz using conventional sound damping materials would need large volumes of material. To be effective, conventional sound damping materials should be provided in a layer having a thickness equal to or greater than one eighth of the wavelength to be damped and preferably one quarter of that wavelength. Thus, to use conventional sound damping materials would require layers of thickness of about 200 mm to 600 mm which would unacceptably increase the size of the apparatus.

The present invention is based at least in part on the insight that the detailed modes of the compartment need not be evaluated. Rather the gas in the compartment can be regarded as a transmission path that enables forces exerted on the gas by moving parts to be transmitted to sensitive parts such as grid plates and sensors. The transmission path is strongly frequency dependent. The invention proposes to provide damping at frequencies determined to be problematic.

Figure 2:
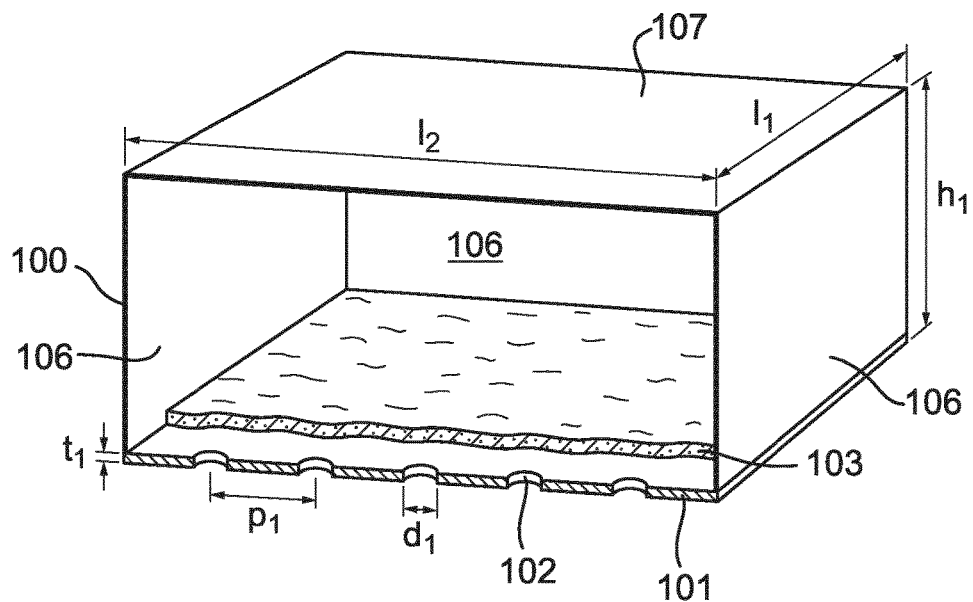
FIG. 2 depicts an acoustic damping device.

FIG. 2 illustrates an acoustic damper according to an embodiment. The acoustic damper comprises a chamber 100, one wall of which is formed by a perforated plate 101 having a plurality of through-holes 102. Although only one row of through-holes 102 is shown, in an embodiment the through-holes 102 are distributed in a two-dimensional pattern across most or all of the perforated plate 101. The perforated plate 101 is in communication with a compartment, e.g. the substrate stage compartment or a mask stage compartment, of the lithographic apparatus in which it is desired to dampen acoustic disturbances that propagate through the ambient gas. The compartment accommodates at least one movable object, for example a substrate stage or a support structure for a patterning device. The acoustic damper is effective to dampen acoustic disturbances having a range of frequencies. The range of frequencies over which the acoustic damper is effective is determined by various parameters, in particular the thickness of the plate $t_1$, the ratio of the total area of through-holes 102 to the total area of perforated plate 101 (i.e. the area of one major surface of the perforated plate, including the area of the through-holes; the length times the width for a rectangular perforated plate), the diameter $d_1$ of through-holes 102 and the spatial distribution of through-holes 102. In an embodiment, values for the various parameters can be chosen to dampen acoustic disturbances of particular frequencies to which parts of the apparatus are sensitive or which are most excited in operation of the lithographic apparatus.

An acoustic damper according to an embodiment is able to damp acoustic disturbances having a wavelength much greater than the dimensions of the chamber 100 because the acoustic damper acts as an acoustic mass-spring system with damping. The gas in chamber 100, which is effectively confined to chamber 100 because of the small size of through-holes 102, is compressible and acts as a spring. Acoustic disturbances outside (i.e. on the compartment side) perforated plate 101 force gas through through-holes 102 into and out of chamber 100. The inertia of the gas which moves through through-holes 102 acts as a mass. Viscous and thermal interactions in the gas passing through through-holes 102 cause acoustic energy to be dissipated and converted to heat, thus having a damping effect. In an embodiment, the dimensions of through-holes 102 are similar to the acoustic boundary layer thickness.

In an embodiment, diameter $d_1$ of through-holes 102 is greater than 0.5 mm, desirably greater than 0.75 mm. In an embodiment, the diameter $d_1$ is less than 1.5 mm, desirably less than 1.25 mm.

In an embodiment, thickness $t_1$ of perforated plate 101 is greater than 1 mm, desirably greater than 2 mm. In an embodiment thickness $t_1$ is less than about 5 mm, desirably less than 4 mm.

In an embodiment, the plate perforation ratio, that is the ratio of the total area of the through-holes 102 to the total area of perforated plate 101, is greater than 0.25%, desirably greater than 0.35%. In an embodiment, the plate perforation ratio is less than about 1%, desirably less than 0.6%.

In an embodiment, the length and breadth $l_1$, $l_2$ of perforated plate 101 and chamber 100 are each greater than 100 mm, desirably greater than 400 mm. In an embodiment, the length and breadth $l_1$, $l_2$ are each less than about 1 m, desirably less than 600 mm. In an embodiment the height $h_1$ of chamber 100 is greater than 30 mm, desirably greater than 50 mm. In an embodiment, height $h_1$ is less than 200 mm, desirably less than 100 mm. In an embodiment, perforated plate 101 has an area in the range of from $10^{-2}$ m$^2$ to 1 m$^2$. In an embodiment, chamber 100 has a volume in the range of from $10^{-4}$ m$^3$ to 0.2 m$^3$.

Side walls 106 and back wall 107 of chamber 100 can be made out of any material compatible with a cleanroom environment, e.g. a metal such as stainless steel or aluminum. Perforated plate 101 can also be made of any material compatible with a cleanroom environment, for example a metal such as stainless steel or aluminum. Through-holes 102 can be formed by any suitable method, such as pressing, drilling, etching or laser beam cutting. Side walls 106 and back wall 107 of chamber 100, as well as perforated plate 101 can, in an embodiment, be incorporated into other parts of the lithographic apparatus.

Optionally, a body of porous material 103 is provided within chamber 100 to increase the damping effect. Porous material 103 can comprise any material which is compatible with a cleanroom environment, e.g. having low out-gassing and negligible particle shedding. Examples of suitable materials include sintered metals, metal foams and metal wool. In an embodiment, porous material 103 is placed in a layer adjacent and parallel to the perforated plate 101 to maximize the flow of gas therethrough. Porous material 103 increases the damping effect by increasing the viscous flow damping of the gas flowing through the through-holes 102 as a result of the acoustic waves.

Figure 3:
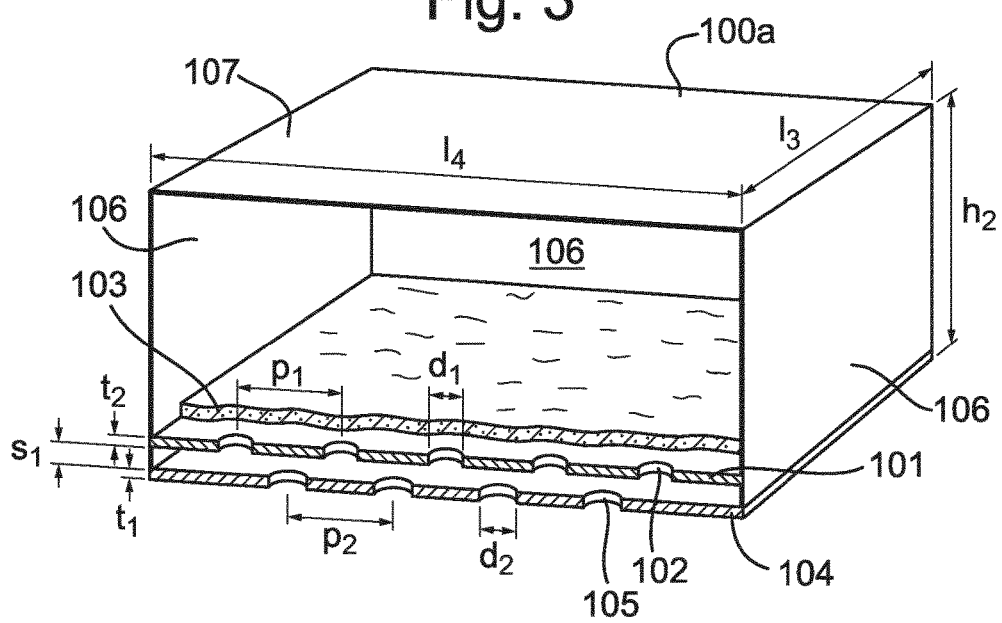
FIG. 3 depicts another acoustic damping device.

FIG. 3 illustrates an acoustic damper 100a according to another embodiment. Acoustic damper 100a is similar to acoustic damper 100 and common parts will not be described again in the interests of brevity. In particular, the dimensions $l_3$, $l_4$, $h_2$ of acoustic damper 100a can be the same as the corresponding dimensions of acoustic damper 100.

Acoustic damper 100a has a second perforated plate 104 outside of perforated plate 101 and spaced therefrom by a distance $s_1$. In an embodiment, $s_1$ is less than about 10 mm. In an embodiment, $s_1$ is less than about 7 mm. In an embodiment, $s_1$ is greater than about 1 mm. In an embodiment, $s_1$ is greater than about 3 mm. Second perforated plate 104 has second through-holes 105 which have a diameter $d_2$ and a pitch $p_2$. At least one of diameter $d_2$ and pitch $p_2$ is different from diameter $d_1$ and pitch $p_1$ respectively of perforated plate 101.

In an embodiment, the diameter $d_2$ of the through-holes 105 is greater than 0.5 mm, desirably greater than 0.75 mm. In an embodiment, the diameter $d_2$ is less than 1.5 mm, desirably less than 1.25 mm.

In an embodiment, the thickness $t_2$ of second perforated plate 104 is greater than 1 mm, desirably greater than 2 mm. In an embodiment thickness $t_2$ is less than about 5 mm, desirably less than 4 mm.

In an embodiment, the plate perforation ratio of second perforated plate 104, that is the ratio of the total area of second through-holes 105 to the total area of the second perforated plate 104, is greater than 0.25%, desirably greater than 0.35%. In an embodiment, the plate perforation ratio of second perforated plate 104 is less than about 1%, desirably less than 0.6%.

By the addition of second perforated plate 104, the frequency dependence of the acoustic damping provided by acoustic damper 100a can be controlled. An acoustic damper with a single plate having holes of uniform diameter and uniform pitch tends to provide a frequency-dependent absorption curve with a main peak of absorption centered around one central frequency. Introduction of second perforated plate 104 with second through-holes 105 of different diameter $d_2$ and/or pitch $p_2$, can shift the central frequency of the absorption peak or broaden the absorption peak. Introduction of a second perforated plate 104 can have the effect of reducing the absorption peak compared to an acoustic damper with a single perforated plate, but may usefully shift the absorption peak to a frequency at which the amplitude of disturbances is high or to which the lithographic apparatus is particularly sensitive.

Figure 4:
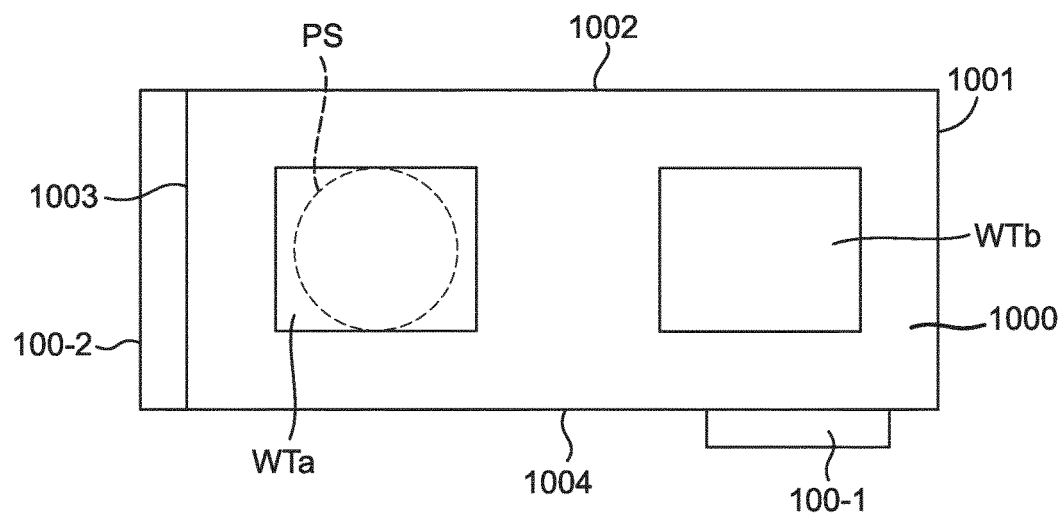
FIG. 4 depicts in plan (top view) a substrate stage compartment.
Figure 5:
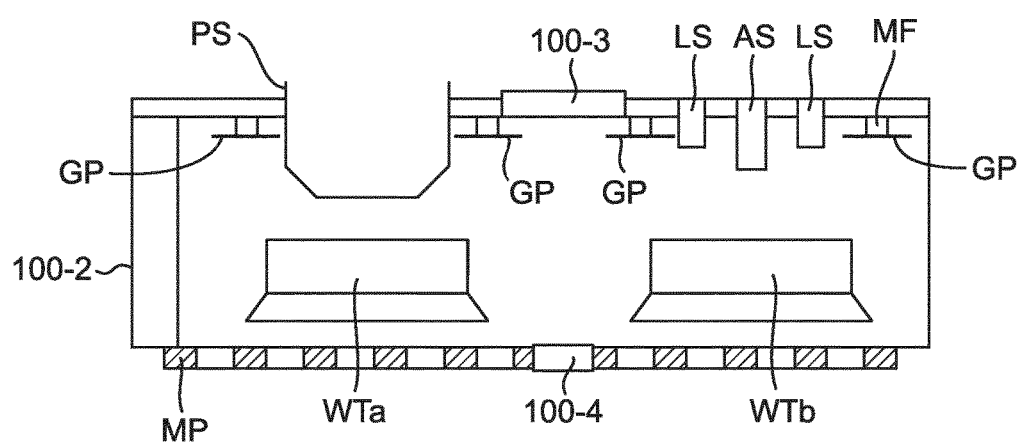
FIG. 5 depicts a side view of the substrate stage compartment of FIG. 4.

FIGS. 4 and 5 depict, in plan and side view respectively, a substrate stage compartment 1000 in which acoustic dampers are provided. Two side walls 1001, 1003 of substrate stage compartment 1000 are formed by parts of a base frame. The base frame serves to provide structural support for various parts of the lithographic apparatus. In an embodiment, the base frame is a fixed structure. Acoustic damper 100-1 according to an embodiment can be integrated in side wall 1004 of the substrate stage compartment that is formed by a part of the base frame. Other side walls 1002, 1004 of the substrate stage compartment 1000 may be formed by removable walls. The removable walls are removable to allow access to components accommodated within the substrate stage compartment 1000, e.g. for servicing or maintenance. The removable walls do not need be structural and an acoustic damper 100-2 can be integrated into all or nearly all of the area of one of the removable walls. In an embodiment, a removable wall accommodates a plurality of acoustic dampers.

An acoustic damper 100-2 can be arranged so that perforated plate 101 is not perpendicular to an adjacent side wall 1002 or 1004. Perforated plate 101 can be arranged at an angle of from 1° to 5° to perpendicular to the adjacent side wall. Arranging perforated plate 101 non-perpendicular to the adjacent side wall reduces the number of resonance modes in the substrate stage compartment.

The top side of the substrate stage compartment 1000 in this embodiment is formed by a reference frame RF. At an exposure station ES, reference frame RF supports projection system PS as well as grid plates GP which are used in combination with encoder heads provided on substrate tables WTa, WTb to measure the position and/or displacements of substrate tables WTa, WTb. At a measurement station MS, various sensors used to characterize a substrate prior to exposure are provided. These sensors may include a level sensor LS and an alignment sensor AS. Grid plates GP are also provided for use in measuring the position of substrate tables WTa, WTb. Other components may also be provided in an upper part of substrate stage compartment 1000 but are omitted for the sake of clarity. For example, in an immersion lithographic apparatus a liquid supply system is provided around the lower part of the projection system PS. In an alternative embodiment there is provided one substrate table WT and one calibration stage.

Due to the various components provided in the upper part of substrate stage compartment 1000, there may not be much space to provide an acoustic damper. However, an acoustic damper 100-3 can be provided in the reference frame RF between the projection system PS and the sensors. An acoustic damper is most effective if it is at or near an anti-node of an acoustic mode to be damped. The present inventors have determined that in an embodiment certain acoustic modes that are most troublesome have anti-nodes at or near the longitudinal center of the substrate stage compartment 1000. An acoustic damper can also be provided behind or above grid plates GP.

The bottom of the substrate stage compartment 1000 is, in an embodiment, mostly formed by a magnet plate MP used in positioning the substrate table WTa, WTb. Positioning system PW for substrate tables WTa, WTb may include a planar motor which has coils that are energized to exert forces against magnet plate MP. Magnet plate MP needs to be substantially continuous across the range of movement of substrate tables WTa, WTb. An acoustic damper 100-4 can be incorporated in a part of the magnet plate where it is not necessary to provide magnets. Alternatively, or in addition, an acoustic damper can be provided just outside the magnet plate MP and communicate with the main part of substrate stage compartment 1000 via apertures in the magnet plate MP. Other apertures may be provided to enable a flow of gas through substrate stage compartment 1000, e.g. for temperature conditioning purposes.

Figure 6:
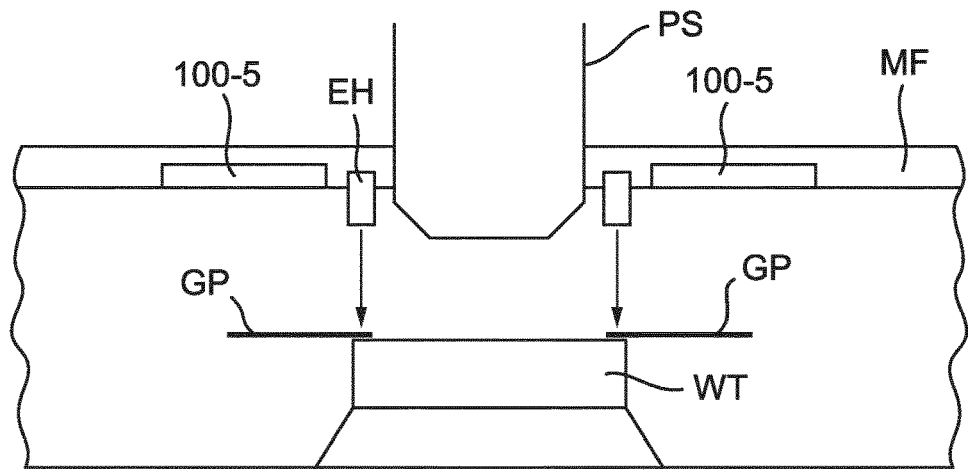
FIG. 6 depicts another substrate stage compartment.

A part of another substrate stage compartment is shown in FIG. 6. In this embodiment, the arrangement of encoder heads EH and grid plates GP used for measuring the position and/or displacements of a substrate table WT is reversed. In other words, grid plates GP are attached to substrate table WT and encoder heads EH are attached to reference frame RF and/or projection system PS. In such an arrangement, there is ample room for acoustic dampers 100-5 on or within the reference frame RF. Accordingly, an embodiment is highly effective when used with an arrangement where grid plates are provided on a substrate table WT.

Figure 7:
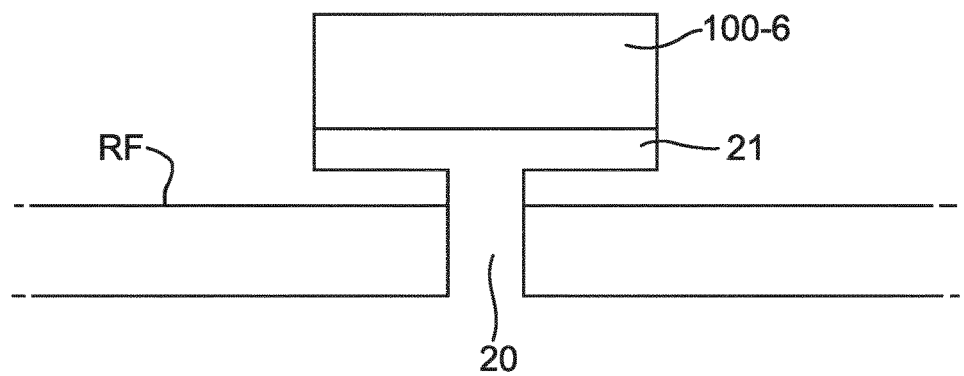
FIG. 7 depicts a part of a reference frame to which is mounted an acoustic damping device.

FIG. 7 depicts an arrangement of an acoustic damper 100-6 which is useful where space is more limited. In the arrangement of FIG. 7, a passageway 20 is provided through a side wall of a compartment or through a component, such as reference frame RF, forming a boundary of a compartment. Passageway 20 leads to a space 21. Acoustic damper 100-6 is provided adjacent to space 21. The shape and configuration of passageway 20 and space 21 can be provided in any arrangement that is convenient given other components of the apparatus. The arrangement of FIG. 7 can be useful in a lithographic apparatus where room is available adjacent the projection system, for example, but not immediately adjacent the substrate stage compartment 1000.

In an embodiment, a plurality of acoustic dampers is arranged adjacent to or communicating with a compartment, e.g. substrate stage compartment 1000 or a mask stage compartment. At least some of the plurality of acoustic dampers are configured to have different frequency-dependent absorption characteristics than others of the plurality of acoustic dampers, e.g. by having different dimensions, different sized through-holes and/or different through-hole pitch.

Figure 8:
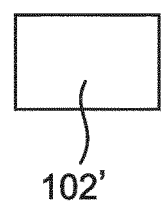
FIG. 8 depicts an alternative shape of through-hole usable.
Figure 9:
FIG. 9 depicts a further alternative shape of through-hole.

FIGS. 2 and 3 depict the through-holes 102, 105 in perforated plates 101, 104 as circular. Circular through-holes can be manufactured very easily. However, it is not necessary that the through-holes are circular and other shapes can be used. FIGS. 8 and 9 depict two such alternative shapes, a rectangle 102' and a star 102". A through hole having a non-circular shape, such as those of FIGS. 8 and 9, can increase the damping effect compared to a circular through-hole of equivalent area because the non-circular shape has a greater perimeter length which increases viscous damping in the gas flowing through the through-hole.

Figure 10:
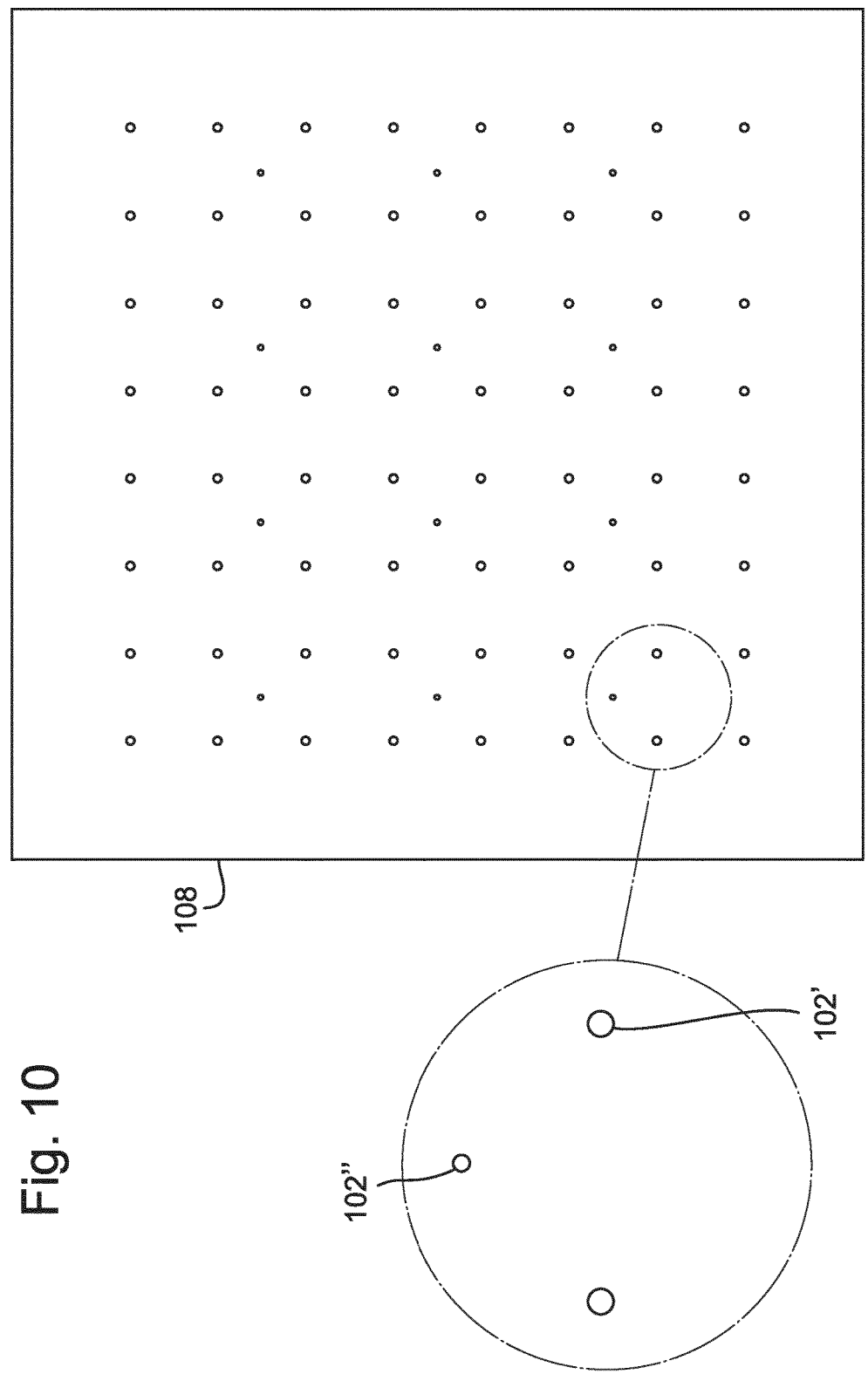
FIG. 10 depicts a perforated plate.

FIG. 10 depicts another perforated plate 108 that is useable in place of either or both of perforated plate 101 and second perforated plate 104. Perforated plate 108 comprises two subsets of through-holes, e.g. through-holes 102 and through-holes 105. Through-holes 102 have diameter $d_1$ and pitch $p_1$. Through-holes 105 have diameter $d_2$ and pitch $p_2$. At least of one diameter $d_2$ and pitch $p_2$ is different from diameter $d_1$ and pitch $p_1$ respectively. Similarly to the arrangement of FIG. 3 which has two perforated plates, the use of perforated plate 108 can provide an absorption peak at a lower frequency but potentially a lower peak absorption.

Figure 11:
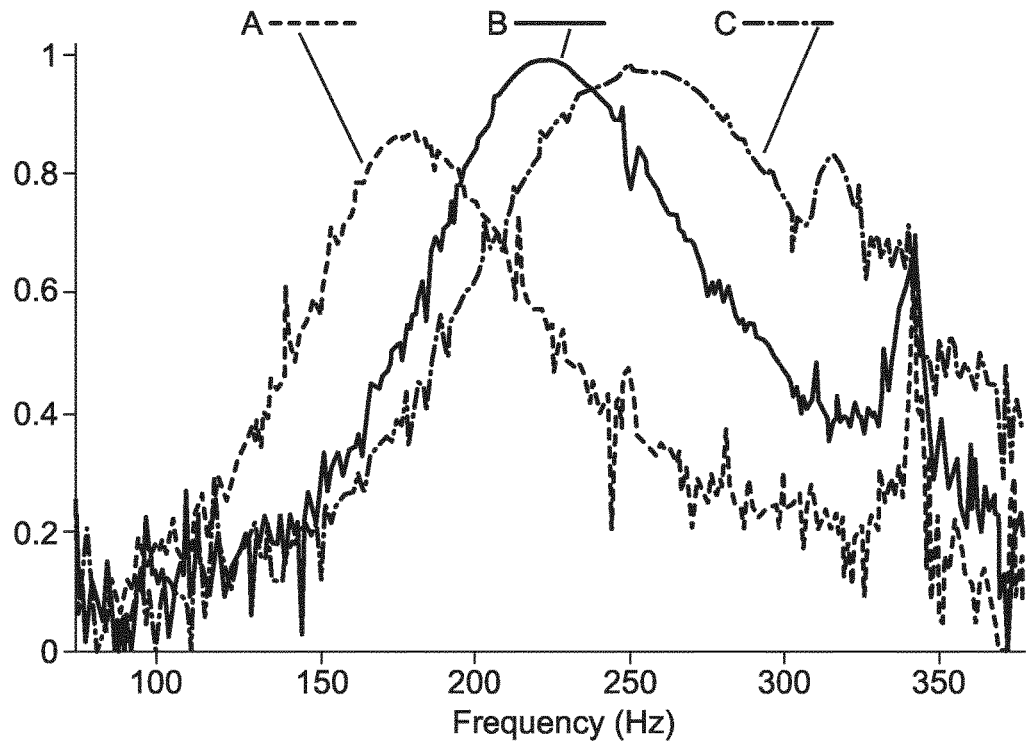
FIG. 11 is a graph of relative absorption for three examples of acoustic dampers.

FIG. 11 is a graph showing the absorption coefficient as a function of frequency for three example acoustic dampers.

Line C shows the frequency-dependent absorption coefficient for an acoustic damper having a perforated plate with a plate perforation ratio of 0.51%, through-holes of diameter 0.85 mm and a plate thickness of 3.0 mm. It will be seen that the absorption coefficient peaks at close to 1 at a frequency of slightly greater than 250 Hertz. The peak is quite broad, with an absorption coefficient greater than 0.8 from about 220 Hertz to almost 300 Hertz. Above 300 Hertz there are a number of small peaks and troughs in the absorption coefficient.

Line B shows the frequency-dependent absorption coefficient for an acoustic damper having a perforated plate with a plate perforation ratio of 0.43%, through-holes of diameter 1.10 mm and a plate thickness of 3.0 mm. In this case, the absorption coefficient reaches a peak at very close to 1 at a frequency of about 220 Hertz. The peak is a little narrower than the peak of example A, being above 0.8 from a little below 200 Hertz to a little above 250 Hertz.

Line A shows the frequency-dependent absorption coefficient for an acoustic damper having the perforated plates of both examples B and C spaced apart by a gap of 5 mm. Although the peak absorption is reduced to a little below 0.9, the frequency of the absorption peak is shifted to about 175 Hertz.

Figure 12:
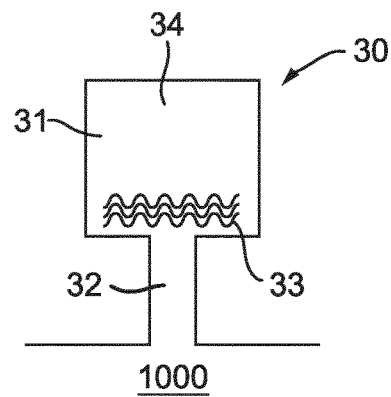
FIG. 12 depicts schematically an acoustic damper based on a Helmholtz resonator.

An acoustic damper based on a Helmholtz resonator is depicted schematically in FIG. 12. Acoustic damper 30 comprises a cavity 31 connected via a conduit 32 (which may also be referred to as a "neck") to a compartment, e.g. substrate stage compartment 1000, in which the acoustic disturbances to be damped are present. A porous material 33 is placed within cavity 31 adjacent the conduit 32. Acoustic damper 30 operates on similar principles to the acoustic dampers using perforated plates described above. Porous material 33 can comprise the same materials as porous material 103. Compressible gas 34 within the cavity 31 acts as a spring and the gas within conduit 32 acts as a mass moving in and out of the damper in response to acoustic disturbances in the compartment. Viscous damping in the conduit 32 provides damping. The frequency dependence of the acoustic damper 30 depends on the size and shape of cavity 31 whilst the amount of damping depends on the dimensions of the conduit 32 and the porous material 33. If the cavity 31 is essentially spherical, acoustic damper 30 will absorb acoustic disturbances over a narrow range of frequencies whereas if the cavity 31 has a more complex shape, acoustic disturbances over a wider range of frequencies will be absorbed.

In an embodiment, acoustic dampers based on Helmholtz resonators can be combined with acoustic dampers incorporating perforated plates as described above. In an embodiment, a plurality of acoustic dampers based on Helmholtz resonators are provided at different locations within or adjacent to a compartment. Some of the plurality of acoustic dampers based on Helmholtz resonators have different dimensions and/or shapes than others of the plurality of acoustic dampers based on Helmholtz resonators. The dimensions of different ones of the plurality of acoustic dampers based on Helmholtz resonators can be selected with reference to their location in the compartment to provide damping of undesirable frequencies of acoustic disturbance.

Figure 13:
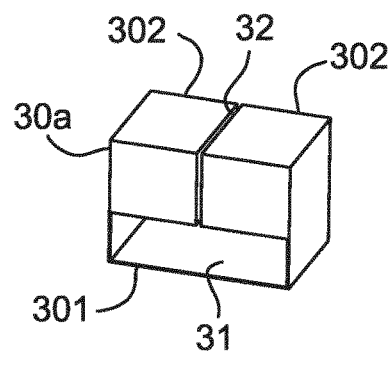
FIG. 13 depicts another acoustic damper based on a Helmholtz resonator.

FIG. 13 depicts an acoustic damper 30a. Acoustic damper 30a comprises a C-shaped member 301 having a base portion and two upstanding flanges generally perpendicular to the base portion. Two blocks 302 are provided between the distal ends of the upstanding flanges. The combined width of blocks 302 is very slightly less than the distance between the distal ends of the upstanding flanges so that only a narrow gap is left between blocks 302 to form conduit 32. The thickness of blocks 302 is less than the length of the upstanding flanges so that a space is left below blocks 302 to form cavity 31. Acoustic damper 30a can be inset within a niche of another component of the apparatus. Side plates may be provided to close cavity 31. Acoustic damper 30a can be constructed easily with a conduit 32 with desired dimensions, in particular a narrow width.

Figure 14:
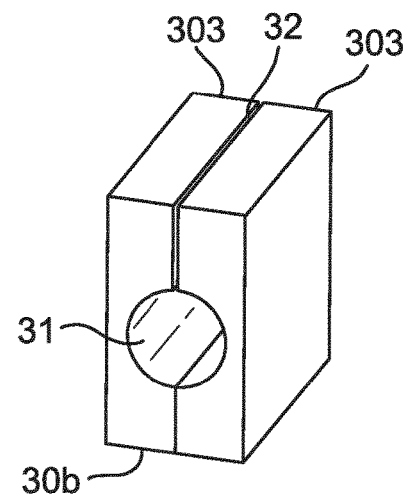
FIG. 14 depicts another acoustic damper based on a Helmholtz resonator.

An acoustic damper 30b based on a Helmholtz resonator is illustrated in FIG. 14. Acoustic damper 30b is formed by two blocks 303 joined together at respective joining faces. A groove, e.g. semi-circular in cross-section, is formed in the joining face of either/or both blocks in order to form cavity 31. Conduit 32 can be formed either by locally removing material from the joining face of one or both blocks 303 or by providing a gasket (not shown) with a gap in it between the blocks 303. Acoustic damper 30b can be constructed using well known manufacturing processes such as casting and milling to accurately form a cavity and conduit of the desired dimensions.

Figure 15:
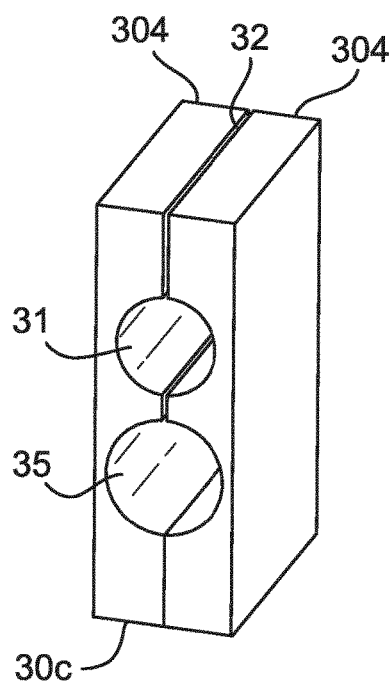
FIG. 15 depicts another acoustic damper based on a Helmholtz resonator.

An acoustic damper 30c based on a Helmholtz resonator is depicted in FIG. 15. Acoustic damper 30c is formed by two blocks 304 joined together at respective joining faces in a similar manner to acoustic damper 30b but two cavities 31, 35 are formed to effect damping at a plurality of frequencies. Cavity 35 has a different shape and/or size than cavity 31. Conduit 32 extends to connect cavity 31 and cavity 35.

Figure 16:
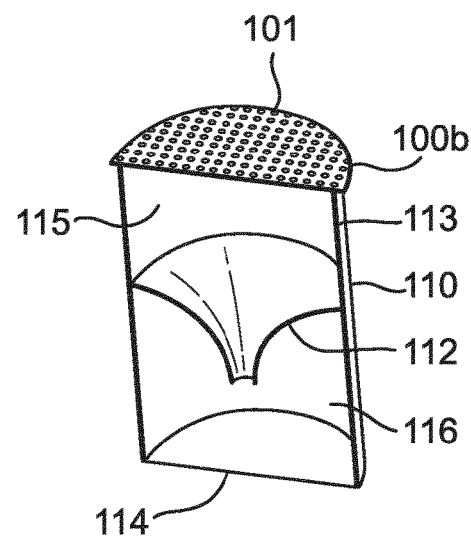
FIG. 16 depicts an acoustic damper combining a Helmholtz resonator and a perforated plate.

FIG. 16 illustrates in partial cross-section an acoustic damper 100b which combines the principles of a perforated plate 101 and a Helmholtz resonator. Acoustic damper 100b is formed of a cylindrical outer wall 110 closed at its lower end by a flat base 114 and at its upper end by perforated plate 101. A funnel shaped baffle 112 is provided within acoustic damper 110 to divide the interior of acoustic damper 110 into an upper cavity 115 and a lower cavity 114. The wider end of funnel-shaped baffle 112 faces upper cavity 115 and a narrower end faces lower cavity 116. As depicted, funnel-shaped baffle 112 has a curved cross-section but other shapes can also be used. It should be noted that the terms "upper" and "lower" are used to describe the orientation of the acoustic damper 100b shown in FIG. 16 but the acoustic damper 100b can be used in any orientation in an apparatus.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains one or more processed layers.

Although specific reference may have been made above to the use of embodiments of the invention in the context of optical lithography, it will be appreciated that the invention may be used in other applications, for example imprint lithography, and where the context allows, is not limited to optical lithography.

The descriptions above are intended to be illustrative, not limiting. Thus, it will be apparent to one skilled in the art that modifications may be made to the invention as described without departing from the scope of the claims set out below.

What is claimed is:

1. A lithographic apparatus for applying a desired pattern onto a substrate, the apparatus comprising:
   a compartment with a volume of gas;
   a movable object within the compartment, wherein a movement of the movable object causes an acoustic disturbance in the gas in the compartment;
   a reference frame on a boundary of the compartment;
   a sensor mounted on the reference frame and configured to measure the object; and
   an acoustic damper located outside the compartment and mounted on the reference frame, configured to damp the acoustic disturbance, and comprising:
   a chamber, and
   a perforated plate comprising a plurality of through-holes therein, the perforated plate being arranged between the chamber and the compartment,
   wherein the reference frame comprises a passageway therethrough that is configured to allow communication between the compartment and the acoustic damper.

2. The apparatus according to claim 1, wherein each of the through-holes has a diameter in the range of from about 0.5 mm to about 1.5 mm.

3. The apparatus according to claim 1, wherein a total area of the plurality of through-holes is in the range of from 0.25% to 1% of a total area of the perforated plate.

4. The apparatus according to claim 1, wherein the plurality of through-holes are of substantially the same diameter.

5. The apparatus according to claim 1, wherein the plurality of through-holes comprises a first subset of through-holes having a first diameter and a second subset of through-holes having a second diameter, the second diameter being different than the first diameter.

6. The apparatus according to claim 1, wherein a specific through-hole of the plurality of through-holes has a shape of a circle, a rectangle, a star, or an ellipse in a plane of the perforated plate.

7. The apparatus according to claim 1, wherein the plurality of through-holes is a first plurality of through-holes, the acoustic damper further comprising a second perforated plate substantially parallel to and spaced from the perforated plate, the second perforated plate having a second plurality of through-holes, and the second plurality of through-holes having a different size and/or pitch than the first plurality of through-holes.

8. The apparatus according to claim 1, wherein the perforated plate is orientated at an angle in the range of about 1° to about 5° to a wall of the compartment.

9. The apparatus according to claim 1, wherein a total area of the perforated plate is in a range of $10^{-2}$ m$^2$ to 1 m$^2$.

10. The apparatus according to claim 1, wherein the chamber has a volume in a range of $10^{-4}$ m$^3$ to 0.2 m$^3$.

11. The apparatus according to claim 1, further comprising a second acoustic damper configured to damp the acoustic disturbance.

12. The apparatus according to claim 1, wherein the acoustic damper is located at an anti-node of a fundamental mode, a first harmonic or a second harmonic, of an acoustic resonance of the compartment.

13. The apparatus according to claim 1, further comprising a projection system configured to project the desired pattern imparted to a radiation beam onto the substrate, wherein:
the compartment is bounded in part by the reference frame;
the acoustic damper is inset in the reference frame; and
the reference frame supports the projection system.

14. The apparatus according to claim 1, further comprising a second acoustic damper configured to damp the acoustic disturbance, wherein:
the compartment is bounded in part by a base frame; and
the second acoustic damper is inset in the base frame.

15. The apparatus according to claim 1, further comprising a second acoustic damper configured to damp the acoustic disturbance, wherein:
the compartment is bounded in part by a removable wall; and
the second acoustic damper is inset in the removable wall.

16. The apparatus according to claim 1, wherein the acoustic damper comprises a layer of sound absorbing material adjacent the perforated plate.

17. The apparatus according claim 1, wherein the movable object is a substrate table or a support structure for a patterning device.

18. A lithographic apparatus for applying a desired pattern onto a substrate, the apparatus comprising:
a compartment with a volume of gas;
a movable object within the compartment, wherein a movement of the movable object causes an acoustic disturbance in the gas in the compartment; and
an acoustic damper configured to damp the acoustic disturbance, and comprising:
a chamber,
a first perforated plate comprising a plurality of first through-holes therein, and
a second perforated plate substantially parallel to and spaced from the first perforated plate, and comprising a plurality of second through-holes having a different size or pitch than the plurality of first through-holes,
wherein the first perforated plate and the second perforated plate are positioned between the chamber and the compartment.

19. A lithographic apparatus for applying a desired pattern onto a substrate, the apparatus comprising:
a plurality of walls defining a compartment;
a movable object within the compartment, wherein a movement of the movable object causes an acoustic disturbance in the compartment;
an acoustic damper within the compartment, the acoustic damper being configured to damp the acoustic disturbance, and comprising:
a chamber, and
a perforated plate between the chamber and the compartment, and comprising a plurality of through-holes therein,
wherein the acoustic damper is inset in one wall of the plurality of walls such that the perforated plate is continuous with the one wall.

* * * * *